(12) United States Patent
Morris et al.

(10) Patent No.: US 6,199,533 B1
(45) Date of Patent: Mar. 13, 2001

(54) PILOT VALVE CONTROLLED THREE-WAY FUEL INJECTION CONTROL VALVE ASSEMBLY

(75) Inventors: Corydon Edward Morris; Gary L. Gant; George L. Muntean; Árpád M. Pataki; Bela Doszpoly, all of Columbus, IN (US)

(73) Assignee: Cummins Engine Company, Inc., Columbus, IN (US)

( * ) Notice: Subject to any disclaimer, the term of this patent is extended or adjusted under 35 U.S.C. 154(b) by 0 days.

(21) Appl. No.: 09/241,081

(22) Filed: Feb. 1, 1999

(51) Int. Cl.⁷ ............................. F02B 3/00; F02M 51/00
(52) U.S. Cl. ............... 123/299; 123/472; 137/627.5; 251/129.15
(58) Field of Search ........................ 123/299, 472; 137/627.5, 596.16, 625, 625.6, 625.17, 625.65, 625.25; 251/129.01, 129.15

(56) References Cited

U.S. PATENT DOCUMENTS

| | | | |
|---|---|---|---|
| 2,646,820 | 7/1953 | McLeod | 137/623 |
| 3,039,491 | 6/1962 | Raney | 137/596.16 |
| 3,196,896 | 7/1965 | Leutenegger | 137/596.16 |
| 3,604,457 | 9/1971 | Douglas | 137/596.16 |
| 3,677,826 | 7/1972 | Pointout et al. | 137/596.16 |
| 3,680,782 | 8/1972 | Monpetit et al. | 239/96 |
| 4,111,226 | 9/1978 | Cameron | 137/269 |
| 4,149,565 | * 4/1979 | Jennings et al. | 137/885 |
| 4,249,497 | 2/1981 | Eheim et al. | 123/446 |
| 4,440,132 | 4/1984 | Terada et al. | 123/446 |
| 4,582,294 | 4/1986 | Fargo | 251/129.15 |
| 4,798,186 | 1/1989 | Ganser | 123/467 |
| 4,826,080 | 5/1989 | Ganser | 239/88 |
| 4,911,127 | * 3/1990 | Perr | 123/446 |
| 5,050,642 | * 9/1991 | Bright | 137/625.65 |
| 5,082,180 | 1/1992 | Kubo et al. | 239/88 |
| 5,337,788 | * 8/1994 | Nelson | 137/627.5 |
| 5,396,926 | 3/1995 | Pataki et al. | 239/88 |
| 5,472,142 | 12/1995 | Iwanaga | 239/96 |
| 5,497,806 | 3/1996 | Swank et al. | 137/625.65 |
| 5,676,114 | 10/1997 | Tarr et al. | 123/446 |
| 5,694,903 | 12/1997 | Ganser | 123/496 |

FOREIGN PATENT DOCUMENTS

| | | |
|---|---|---|
| 537372 | 9/1939 | (GB) . |
| 6469876 | 3/1989 | (JP) . |

* cited by examiner

*Primary Examiner*—Noah P. Kamen
*Assistant Examiner*—Mahmoud M Gimie
(74) *Attorney, Agent, or Firm*—Nixon Peabody LLP; Charles M. Leedom, Jr.; Tim L. Brackett, Jr.

(57) ABSTRACT

A three-way fuel injection control valve assembly is provided which includes a pilot valve for controlling the movement of a drain valve member and a separate supply valve member to minimize valve response time and transition flow losses. The solenoid operated two-way pilot valve controls the flow of fuel from a control volume formed adjacent the ends of the drain valve member and the supply valve member to begin and end an injection event. A transition flow loss limiting feature is provided which causes the drain valve member to close prior to the opening of the supply valve member and subsequently causes the supply valve member to close prior to the opening of the drain valve member during a given injection event thereby minimizing transition flow losses. The transition flow loss limiting feature includes sizing the cross sectional areas of the supply valve member and the drain valve member, sizing a bias plunger for biasing the drain valve member and sizing one or more bias springs so that no opening overlap occurs between the supply valve member and the drain valve member.

27 Claims, 7 Drawing Sheets

FIG. 9 ced PILOT VALVE CONTROLLED THREE-WAY FUEL INJECTION CONTROL VALVE ASSEMBLY

TECHNICAL FIELD

The present invention relates to a solenoid operated three-way valve for high pressure fuel systems which effectively minimizes valve response time and transition flow losses while accurately controlling the timing and quantity of fuel injection.

BACKGROUND OF THE INVENTION

Three-way solenoid valves have long been used for controlling fluid flow in a variety of air and hydraulic systems, particularly fuel systems. Such three-way solenoid valves often control the passage of fluid under high pressure from a source to a load device and selectively interrupt the flow of pressurized fluid while simultaneously connecting the load device to a substantially unpressurized drain. Typically, a three-way valve includes a valve housing having first, second and third valve passages interconnected by an internal valve chamber containing two valve seats and a valve element movable to control fluid flow among the three valve passages by moving between (1) a first position in which the movable valve member engages a first one of the valve seats to isolate a first one of the valve passages from the internal chamber while allowing fluid communication between the second and third valve passages through the second valve seat and internal chamber, and (2) a second position in which the movable valve member engages the second valve seat to isolate a second one of the valve passages while allowing fluid communication between the first and third valve passages through the first valve seat and internal chamber.

Recent and upcoming legislation resulting from a concern to improve fuel economy and reduce emissions continues to place strict emissions standards on engine manufacturers. In order for new engines to meet these standards, it is necessary to produce fuel injection systems capable of achieving higher injection pressures while maintaining accurate and reliable control of the metering and timing functions. Three-way valves have been particularly useful in achieving new levels of operation by effectively controlling the flow of fuel in high pressure fuel systems, such as disclosed in PCT patent publication WO 94/27041, entitled *Compact High Performance Fuel System With Accumulator.* A "pin-within-a-sleeve" type three-way solenoid operated valve, such as disclosed in U.S. Pat. No. 5,396,926 issued to Pataki et al., is especially effective in handling very high fuel pressures while providing extremely fast response time. This pin-within-a-sleeve type three-way valve includes a hollow movable valve member having an armature connected to one end thereof for direct operation by a solenoid actuator assembly. A three-way valve also includes a floating inner pin telescopingly received within the hollow movable valve member. In an advanced position, the hollow movable valve member is biased into engagement with a first valve seat formed in the surrounding valve housing. In a solenoid retracted position, the movable valve member is biased against the floating inner pin to open the first valve seat and close a second valve seat located within the hollow movable valve member and positioned to be engaged by one end of the floating inner pin. This particular pin-within-a-sleeve design has been found to be especially advantageous in controlling relatively high pressure fuel flow due to its pressure balanced design. Moreover, the components of this particular valve are packaged to form a more compact assembly.

Although the pin-within-a-sleeve three-way valve disclosed in Pataki et al. functions to effectively control the timing and quantity of fuel injection, valve designers continually strive to increase pressure capability and minimize the response time, transition flow losses, leakage flow and complexity of valve assemblies, including the Pataki et al. valve.

Consequently, there exists a need for a three-way fuel injection control valve capable of effectively increasing the pressure capability and reducing valve response time, transition flow loss and leakage flow.

SUMMARY OF THE INVENTION

It is an object of the present invention, therefore, to overcome the disadvantages of the prior art and to provide a simple, low cost three-way fuel injection control valve capable efficiently and effectively controlling the timing and quantity of fuel injection.

Another object of the present invention is to provide a three-way fuel injection control valve capable of minimizing valve response time.

Yet another object of the present invention is to provide a three-way fuel injection control valve including a solenoid actuator wherein minimal electromagnetic forces are required for fast, effective operation.

Still another object of the present invention is to provide a compact, inexpensive three-way fuel injection control valve designed to reduce manufacturing costs while achieving accurate reliable control of fuel flow at extremely high fuel pressures.

Another object of the present invention is to provide a compact, inexpensive three-way fuel injection control valve capable of effectively controlling fuel injection timing and metering at very high engine speeds.

It is yet another object of the present invention is to provide a three-way fuel injection control valve capable of providing multiple injections.

It is a further object of the present invention is to provide a three-way fuel injection control valve capable of minimizing fuel leakage to drain.

A still further object of the present invention is to provide a three-way fuel injection control valve capable of minimizing transition flow losses as the valve moves between closed and open positions.

Another object of the present invention is to provide a three-way fuel injection control valve capable of minimizing the heat transferred to the fuel drain.

Yet another object of the present invention is to provide a three-way fuel injection control valve including a servo-controlled valve element having a control volume wherein the volume of the control volume is minimized.

Still another object of the present invention is to provide a three-way fuel injection control valve assembly having a minimum number of high pressure joints and passages.

These and other objects of the present invention are achieved by providing a three-way fuel injection control valve assembly comprising a valve housing containing at least one valve chamber, a high pressure supply circuit, a drain circuit and an outlet circuit communicating with the valve chamber. The valve assembly also includes a first valve member mounted for reciprocal movement within the valve chamber between a closed position in which the high pressure supply circuit is isolated from the outlet circuit and an open position in which the high pressure supply circuit is in fluid communication with the outlet circuit. The valve assembly also includes a second valve member mounted for reciprocal movement within the valve chamber between an open position in which the outlet circuit is in fluid communication with the drain circuit and a closed position in which the outlet circuit is isolated from the drain circuit. Moreover, the valve assembly includes a valve control device for controlling the movement of the first and the second valve members between respective open and closed positions wherein the valve control device includes a control volume positioned adjacent outer ends of the first valve member and the second valve member for receiving high pressure fuel from the high pressure supply circuit and an electronically controlled injection control valve positioned along the drain circuit for controlling the flow of fuel from the high pressure supply circuit through the drain circuit so as to cause the movement of the first and the second valve members between respective open and closed positions. The movement of the first valve member from the closed position to the open position and subsequently from the open position to the closed position defines a supply period.

The valve control device may further include a transition flow loss limiting feature for causing the second valve member to be positioned in the closed position throughout the supply period when the first valve member is in the open position to minimize high pressure supply fuel flow to drain during opening and closing of the first valve member. The transition flow loss limiting feature may include a biasing device for biasing the second valve member toward at least one of the open and the closed positions. The biasing device may include a pressure bias surface associated with the second valve member for creating fuel pressure biasing forces tending to move the second valve member toward the closed position. The biasing device may include a bias plunger and the bias surface may be formed on the bias plunger. The biasing device may further include a bias spring for biasing the bias plunger toward the second valve member. The high pressure supply circuit may include a first supply passage formed in the first valve member, a second supply passage formed in the second valve member for delivering high pressure fuel to the first supply passage and a third supply passage formed in the bias plunger. The first, second and third supply passages may extend along a common longitudinal axis of the valve assembly.

The control valve assembly may include a first valve seat formed on the second valve member for sealing engagement by the first valve member when the first valve member is in the closed position and a second valve seat formed on the valve housing for sealing engagement by the second valve member when the second valve member is in the closed position. The control volume may be positioned axially between the injection control valve and the first and second valve seats. Preferably, the injection control valve is a two-way valve and includes a solenoid actuator assembly. The transition flow loss limiting feature may further include a differential pressure area design formed on the first valve member for causing pressure forces tending to close the first valve member to be greater than the pressure forces tending to open the first valve member when the first valve member is in the closed position. The transition flow loss limiting feature may further include a first valve bias spring for biasing the first valve toward the closed position.

The first and the second valve members may be mounted in respective first and second valve chambers formed in the valve housing a spaced distance from one another. The first and the second valve chambers may be positioned along a common longitudinal axis. The drain circuit may include a drain orifice for establishing a minimum control pressure when the injection control valve is in an open position. The high pressure supply circuit may include a supply orifice for limiting the supply flow to the injection control valve. The three-way fuel injection control valve assembly may further include a cavitation control device for minimizing cavitation in the outlet circuit which includes a pressure regulating device positioned in the drain circuit for maintaining fuel in the outlet circuit at a regulated pressure when the second valve member is in the open position. The control valve assembly may further include a rate shaping device positioned to control fuel flow from the control volume for causing a gradual increase in fuel pressure in the outlet circuit. The rate shaping device may include a spring biased flow limiting valve mounted adjacent the outer end of the first valve member for permitting unrestricted flow into the control volume, limiting an initial flow from the control volume and allowing additional unrestricted flow from the control volume. In the preferred embodiment, the second valve member contains a cavity opening into at least one end of the second valve member and the first valve member is telescopingly received in the cavity of the second valve member.

In another embodiment of the present valve assembly, a control plunger may be provided between the supply valve member and the control volume. The control plunger includes an outer diameter greater than the outer diameter of the supply valve member so as to cause the resultant force on the movable valve members to move the valve members in the desired direction. An adjustable stop may also be provided adjacent the supply valve member for adjusting the stoke of the supply valve member. In yet another embodiment, the fuel injection pilot control valve may be positioned adjacent the longitudinal axis of the fuel injection control valve assembly to provide a smaller axial package.

DETAILED DESCRIPTION OF THE INVENTION

Figure 1A:
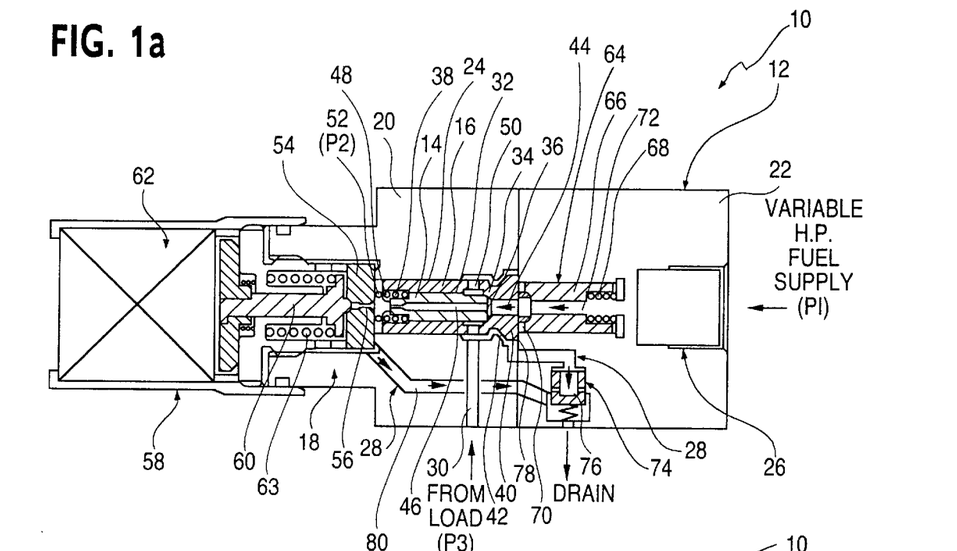
FIG. 1a is a cross sectional view of a pilot valve controlled three-way fuel injection control valve assembly in accordance with a preferred embodiment of the present invention in the closed and de-energized state.
Figure 1B:
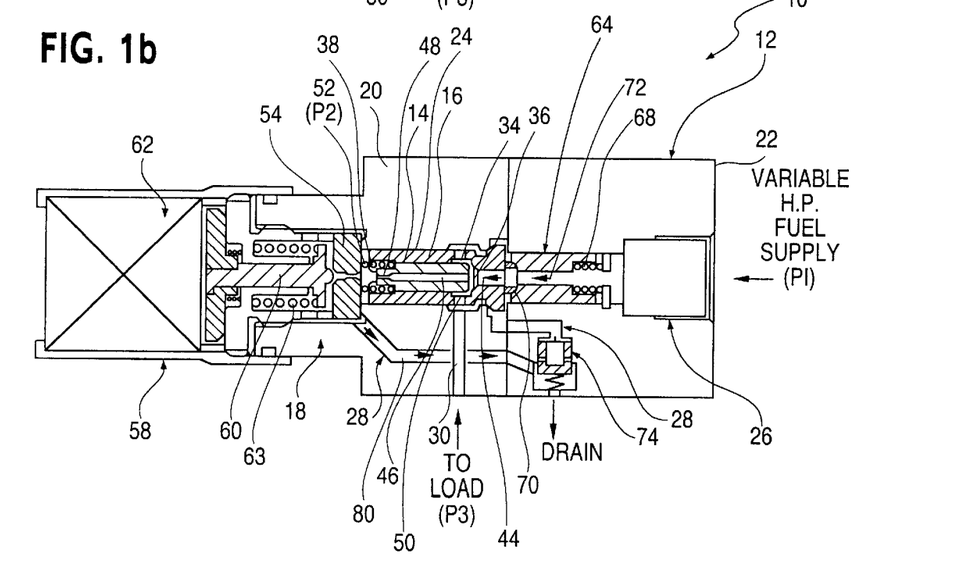
FIG. 1b is a cross sectional view of the pilot valve controlled three-way fuel injection control valve assembly of FIG. 1a in the open and energized state.

Referring to FIGS. 1a and 1b, the pilot valve controlled three-way fuel injection control valve assembly of the present invention, indicated generally at 10, includes a valve housing 12, a supply valve member 14, a drain valve member 16 and a valve control device 18 for controlling the movement of supply valve member 14 and the drain valve member 16 between respective open and closed positions so as to effectively control the timing and quantity of fluid delivered to a load device. Preferably, the pilot valve controlled three-way control valve assembly 10 is used in a fuel system for delivering precise quantities of fuel to an engine at the appropriate time. The arrangement of supply valve member 14 and drain valve member 16 in combination with valve control device 18 effectively minimizes valve response time and transition flow losses during valve operation thereby improving the effectiveness and efficiency of the fuel injection system and, ultimately, enhancing the operation of the associated engine.

Valve housing 12 includes a first portion 20 and a second portion 22 containing a valve chamber 24 extending therethrough for receiving supply valve member 14 and drain valve member 16. First portion 20 and second portion 22 may be held in compressive abutting relationship in any conventional manner. A high pressure supply circuit 26 is formed partially by one end of valve chamber 24 formed in second portion 22 for delivering a high pressure fuel supply to control valve assembly 10. High pressure supply circuit 26 may be connected to any constant or variable high pressure fuel supply, such as an accumulator (not illustrated) which is adapted to temporarily retain fuel at very high pressure, for example, in excess of 5,000–30,000 psi. Such pressures are highly desirable in order to achieve high engine efficiency and low emissions. Of course, the high pressure fuel supply may be any other form of controllable supply such as a high pressure common rail or a dedicated pump assembly, such as typically incorporated in a pump-line-nozzle system or a unit injector system incorporating, for example, a mechanically actuated plunger into the injector body. A drain circuit 28 is also formed in valve housing 12 for returning drain fuel to a fuel supply (not shown). Also, an outlet circuit 30 is formed in valve housing 12 and fluidically connected to valve chamber 24 for delivering high pressure fuel to a load device such as a fuel injector.

The present invention provides a three-way valve which is ideally suited to control the supply of high pressure fuel from an accumulator to the individual cylinders of an internal combustion engine, for example via a rotary distributor and plurality of fuel injectors, but may be used in any environment for any purpose requiring fluid control under conditions of high pressure, high speed and precise control. That is, the present control valve assembly 10 is preferably used in a fuel injection system to control the beginning and end of injection into each cylinder of an internal combustion engine based on command signals from an electronic control system (not shown).

Drain valve member 16 is reciprocally mounted in valve chamber 24 and sized to create a close sliding fit with a portion of valve housing 12 forming valve chamber 24 so as to create a partial fluid seal between the components. Drain valve member 16 includes a valve cavity 32 opening into one end of drain valve member 16 for receiving supply valve member 14. Supply valve member 14 is reciprocally mounted in valve cavity 32 and sized to form a close sliding fit so as to create a partial fluid seal between the outer surface of supply valve member 14 and the inner surface of drain valve member 16 forming cavity 32. The inner end of supply valve member 14 includes an annular valve surface 34 for contacting an annular first valve seat 36 formed on drain valve member 16 in valve cavity 32. A first valve bias spring 38 is positioned in valve cavity 32 at an opposite end from first valve seat 36 for biasing supply valve member 14 into a closed position with valve surface 34 in sealing abutment against first valve seat 36. Drain valve member 16 also includes an annular valve surface 40 formed on its outer surface for sealing abutment against an annular second valve seat 42 formed on first portion 20 of valve housing 12. Valve surface 40 moves into sealing abutment with second valve seat 42 when drain valve member 16 is in the closed position and is biased away from second valve seat 42 into an open position by first valve bias spring 38. High pressure supply circuit 26 includes a high pressure supply passage 44 extending axially from one end of drain valve member 16 to valve cavity 32. High pressure supply circuit 26 also includes a supply passage 46 extending axially from the inner end of supply valve member 14 and terminating prior to the outer end of supply valve member 14 and a transverse supply passage 48 extending from the terminal end of supply passage 46 transversely through drain valve member 16 to communicate with valve cavity 32. Supply passage 48 functions as a supply orifice as described more fully hereinbelow. Transverse outlet passages 50 are formed in drain valve member 16 to fluidically connect supply passage 44 with outlet circuit 30 when supply valve member 14 is in an open position.

Valve control device 18 includes a control volume 52 formed at one end of valve cavity 32 adjacent the outer ends of supply valve member 14 and drain valve member 16. A valve plate 54 is mounted in first portion 20 of valve housing 12 adjacent control volume 52 and includes a drain passage and orifice 56 for fluidically connecting control volume 52 to drain circuit 28. Control volume 52 is positioned to receive high pressure fuel from supply passage 46 and supply passage and orifice 48. Valve control device 18 further includes an injection control valve 58 mounted on one end of first portion 20 of valve housing 12 for functioning as a pilot valve to control the flow of fuel from high pressure supply circuit 26 and control volume 52 to drain circuit 28 so as to cause movement of supply valve member 14 and drain valve member 16 between respective open and closed positions. Injection control valve 58 includes a reciprocally mounted valve element 60 and a fast acting actuator assembly 62, i.e. solenoid operated actuator, capable of quickly and precisely controlling the movement of valve element 60 upon receipt of an electronic control signal. Valve element 60 is positioned for sealing abutment against valve plate 54 when in the closed position as shown in FIG. 1a so as to block fuel flow through drain passage and orifice 56. Energization of actuator assembly 62 causes injection control valve element 60 to move to an open position permitting flow from control volume 52 through drain passage and orifice 56 into drain circuit 28. Valve element 60 is biased into a closed position by a bias spring 63.

Figure 2:
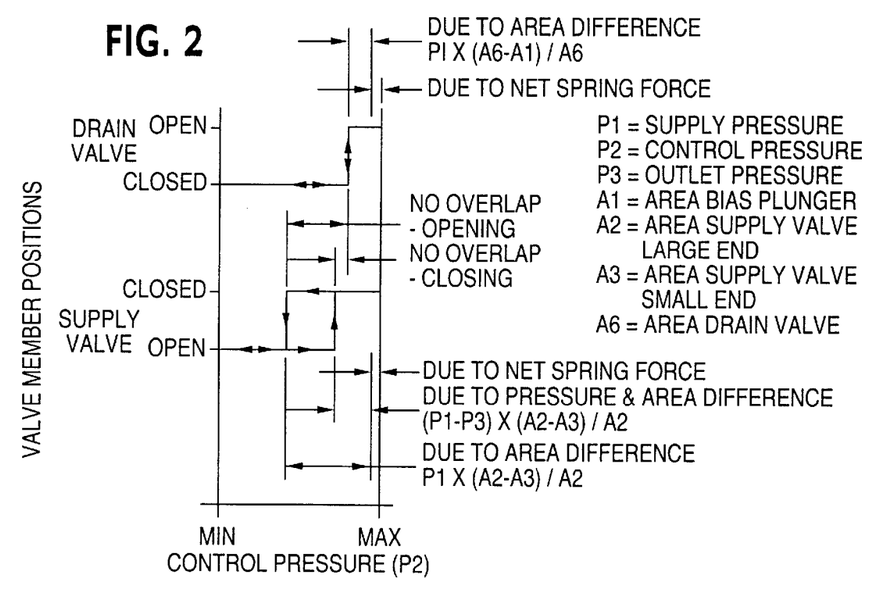
FIG. 2 is a graphical representation of the operation of the drain valve and supply valve of the control valve assembly of the present invention with respect to control pressure.

Valve control device 18 further includes a transition flow loss limiting feature or means 64 which importantly functions to cause drain valve member 16 to be positioned in the closed position throughout the period in which supply valve member 14 is in an open position thereby minimizing high pressure supply fuel flow to drain circuit 28 during the opening and closing of supply valve member 14. That is, transition flow loss limiting feature 64 ensures that drain valve member 16 closes prior to the opening of supply valve member 14 and that drain valve member 16 opens after supply valve member 14 closes during a given supply period or injection event. Referring to FIG. 2, the opening and closing of drain valve member 16 and supply valve member 14 are shown graphically as a function of control pressure P2 in control volume 52.

Figure 3:
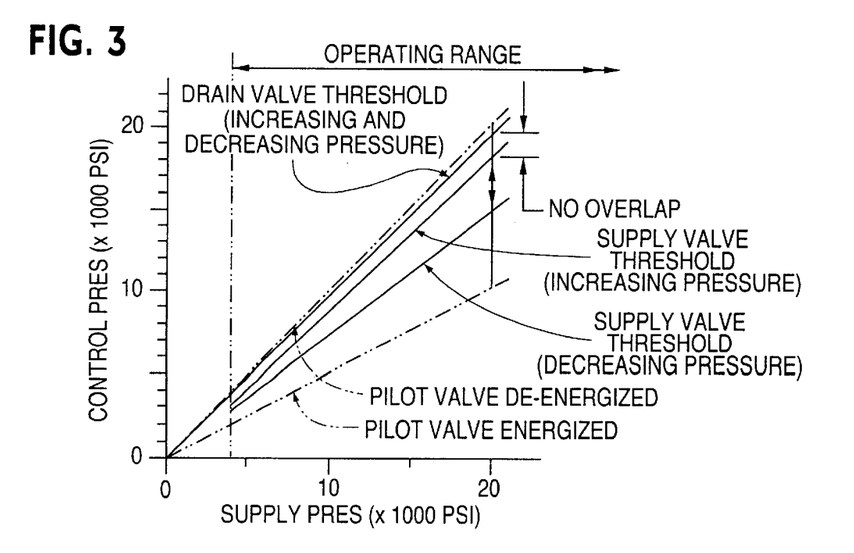
FIG. 3 is a graphical representation of the operation of the supply and drain valves of the present control valve assembly based on control pressure and supply pressure.

Importantly, transition flow loss limiting feature 64 includes a bias plunger 66 mounted in the portion of valve chamber 24 formed in second portion 22 of valve housing 12. Bias plunger 66 is reciprocally mounted in valve chamber 24 and biased toward drain valve member 16 by a bias spring 68. A seal link 70 is positioned in compressive abutment between bias plunger 66 and the inner end of drain valve member 16. High pressure supply circuit 26 includes an axial passage 72 extending through bias plunger 66 and seal link 70 to fluidically connect the high pressure fuel supply to supply passage 44 for delivery to control volume 52. Bias plunger 66 includes a pressure bias surface or area, i.e., formed on its outer end, for creating fuel pressure biasing forces tending to move drain valve member 16 toward the closed position thereby ensuring the closing of drain valve member 16 prior to the opening of supply valve member 14. Referring to FIG. 1b and FIG. 2, the various cross sectional areas of supply valve member 14, drain valve member 16 and bias plunger 66, and the spring force of bias spring 68 and first valve bias spring 38, are sized relative to one another according to the relationship set forth in FIG. 2 so as to ensure that no overlap exists between the opening and closing of supply valve member 14 and drain valve member 16. For example, the large or outer end of supply valve member 14 is formed with a cross sectional area A2 adjacent control volume 52 which is larger than the cross sectional area A3 of the opposite inner or small end of supply valve member 14 exposed to the pressure P1 of the high pressure fuel supply when supply valve member 14 is in the closed position thereby creating net pressure forces tending to maintain supply valve member 14 in the closed position during movement of drain valve member 16 into the closed position to ensure supply valve member 14 does not open prior to closing of drain valve member 16. Although this differential pressure area of supply valve member 14 also requires a greater control pressure P2 to move supply valve member 14 into a closed position, drain valve member 16 and bias plunger 66, in combination with the net spring force of bias spring 68 and first valve bias spring 38, are sized in accordance with the equations in FIG. 2 so as to ensure the opening of drain valve 16 occurs after the closing of supply valve member 14. FIG. 3 also illustrates the overlap prevention or transition flow loss limiting function of the present three-way fuel injection control valve assembly as a function of supply pressure.

The present embodiment of control valve assembly 10 also includes a cavitation control device 74 for minimizing cavitation in outlet circuit 30 when outlet circuit 30 is connected to drain circuit 28 during the opening of drain valve member 16. Cavitation control device 74 includes a drain regulating valve 76 positioned in drain circuit 28 for regulating the flow through drain circuit 28 so as to limit the rate of the pressure decrease in outlet circuit 30 when outlet circuit 30 is connected to drain circuit 28 at the end of a supply period or injection event. For example, as shown in FIGS. 1a and 1b, drain regulating valve 76 may be in the form of a reciprocally mounted, spring biased piston which moves toward an open position permitting flow therethrough when pressure in the upstream portion of drain circuit 28 reaches a predetermined level, but moves toward a closed position as the upstream pressure decreases thereby throttling the flow through drain circuit 28 to maintain the pressure in outlet circuit 30 at a regulated pressure. Cavitation, i.e. vapor pockets or voids, in outlet circuit 30 and any downstream passages leading to, for example, fuel injector nozzle assemblies, results in insufficient injection pressure and unpredictable, uncontrollable variations in both fuel quantity and timing of injection. Cavitation is especially prone to occur in high pressure lines of fuel systems where such lines are connected to a low pressure drain on a cycle-by-cycle basis. Cavitation control device 74 effectively minimizes the occurrence of cavitation by restricting the return or reverse fuel flow during the draining event to create an optimal back pressure for minimizing cavitation.

During operation, with injection control valve 58 in the de-energized state and valve element 60 in the closed position as shown in FIG. 1a, the pressure of the fuel in control volume 52 is at a maximum level causing supply valve member 14 to be positioned in a closed position against first valve seat 36. Moreover, drain valve member 16 is positioned in an open position and in abutment against a stop surface 78 formed on second portion 22 of valve housing 12. At a predetermined time during, for example, the operation of an engine, a control signal will be delivered to injection control valve 58 causing energization of solenoid actuator assembly 62 and movement of valve element 60 into an open position permitting flow through drain passage and orifice 56. As a result, high pressure fuel will flow from control volume 52 through drain passage and orifice 56 into drain circuit 28. The decreasing pressure in control volume 52 will cause drain valve member 16 and supply valve member 14 to move to the left as shown in FIG. 1b as the fuel pressure forces tending to close drain valve member 16, i.e. the pressure forces acting on bias plunger 66, overcome the pressure forces tending to open drain valve member 16, i.e. pressure force acting on the end of drain valve member 16 in control volume 52. During the movement of drain valve member 16 and supply valve member 14 to the left as shown in FIG. 1b, drain valve member 16 will sealingly engage second valve seat 42 while supply valve member 14 remains in the closed position as shown in FIG. 2. Immediately thereafter, the control pressure in control volume 52 will decrease to a level which permits the pressure forces acting on the inner end of supply valve member 14 to overcome the pressure forces and the spring force acting on the outer end of supply valve member 14 in control volume 52 so as to move supply valve member 14 into the open position. As a result, high pressure fuel is delivered to outlet circuit 30. During the flow of high pressure fuel from control volume 52, supply passage and orifice 48 limits the flow handled by injection control valve 58. Moreover, drain orifice 56 functions to set a minimum control pressure when injection control valve 58 is open. The drain from injection control valve 58 is directed to drain circuit 28 via a branch passage 80. At the end of the injection event, the solenoid actuator assembly 62 is de-energized causing valve element 60 to move into the closed position blocking fuel flow through drain orifice 56. As a result, the pressure in control volume 52 begins to increase as shown in FIG. 2. At a predetermined control pressure, the pressure forces tending to close supply valve member 14 overcome the pressure forces tending to open supply valve member 14, in part due to the differential pressure area at each end of supply valve member 14, thereby causing supply valve member 14 to move toward the closed position. After supply valve member 14 is in the closed position and as control pressure P2 continues to increase, a predetermined control pressure level will be reached at which the pressure forces tending to open drain valve member 16 are greater than the pressure forces tending to close drain valve member 16 thereby moving drain valve member 16 into the open position against the fuel pressure bias force of bias plunger 66 and bias force of spring 68. Preferably, bias plunger 66 is designed with a slightly smaller diameter than the outer diameter of drain valve member 16 thereby ensuring that drain valve member 16 is moved, and maintained, in the open position until the next injection event.

The control valve assembly 10 of the present embodiment is especially advantageous in creating a fast response valve due to a limited control pressure volume while creating a compact valve assembly having a minimum number of high pressure joints and passages. The present invention also effectively minimizes flow losses by minimizing the amount of fuel dumped to drain from injection control valve 58 since valve 58 is closed at all times except during an actual injection event. This drain flow is also limited during the injection event by supply passage and orifice 48 and drain orifice 56. Also, flow losses are minimized during the transition of the valve between open and closed positions by eliminating any valve overlap so that the drain valve member securely and reliably closes prior to the opening of the supply valve member and the drain valve member opens only after the supply valve member has closed at the end of an injection event.

Figure 4:
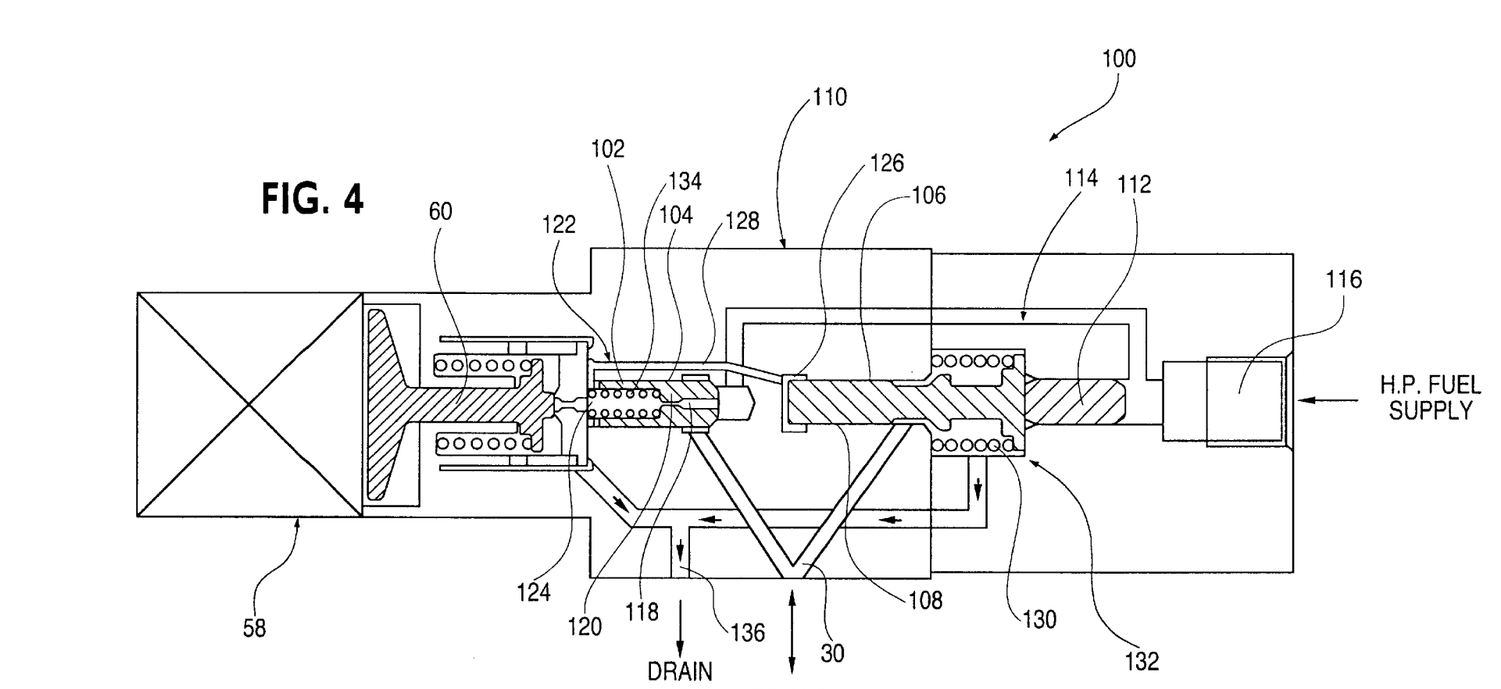
FIG. 4 is a cross sectional view of a second embodiment of the pilot valve controlled three-way fuel injection control valve assembly of the present invention.

Referring to FIG. 4, there is shown a second embodiment of the pilot valve controlled three-way fuel injection control valve assembly, indicated generally at 100, which is similar to the previous embodiment except that a supply valve member 102 is positioned in a first valve chamber 104 while a drain valve member 106 is positioned in a second valve chamber 108 formed a spaced distance from the first valve chamber 104. First valve chamber 104 and second valve chamber 108 are formed in a valve housing 110 so as to position supply valve member 102 and drain valve member 106 in an end-to-end relationship with the valve members moving along a common longitudinal axis. A bias plunger 112 is positioned at the opposite end of the drain valve member as in the previous embodiment. Another distinction of the present embodiment is that a high pressure supply circuit 114 is formed in the valve housing 110 so as to fluidically connect the inlet 116 with one end of first valve chamber 104 without extending through bias plunger 112 and drain valve member 106. High pressure supply circuit 114 also includes an axial supply passage 118 extending through supply valve member 102 and a supply orifice 120 formed along axial supply passage 118. As a result of the axial positioning of supply valve member 102 and drain valve member 106, a control volume, indicated generally at 122, includes a first control cavity 124 positioned at one end of supply valve member 102, a second control cavity 126 positioned at one end of drain valve member 106 axially between drain valve member 106 and supply valve member 102 and the control volume passage 128 connecting first control cavity 124 and second control cavity 126. The present embodiment also includes a drain valve bias spring 130 which provides a relatively low bias force to ensure drain valve member 106 and supply valve member 102 are never in the open position at the same time. The remaining components and features of the present embodiment are the same as the previous embodiment and are indicated by like reference numerals. Like the previous embodiment, control valve assembly 100 also includes a transition flow loss limiting feature indicated generally at 132 which ensures the closing of drain valve member 106 prior to the opening of supply valve member 102 and the subsequent closing of supply valve member 102 prior to the opening of drain valve member 106 so that transition flow losses are minimized. Transition flow loss limiting feature 132 includes effective cross sectional areas on each end of supply valve member 102, effective cross sectional area of drain valve member 106 in second control cavity 126, effective cross sectional area of bias plunger 112 and the bias force of supply valve spring 134 and drain valve bias spring 130. It should be readily apparent based on the above discussion with respect to a first embodiment how the cross sectional areas and bias spring forces are sized relative to one another to likewise preclude opening overlap as set forth in FIG. 2. It should also be noted that the present embodiment may also include a cavitation control device positioned along drain circuit 136.

Figure 5:
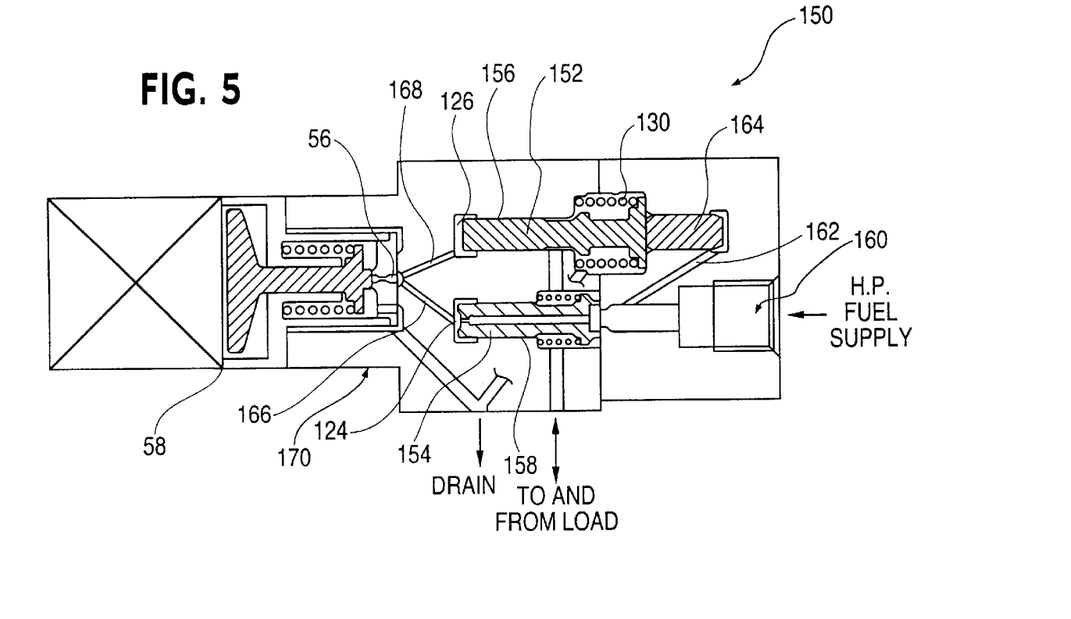
FIG. 5 is a cross sectional view of a third embodiment of the pilot valve controlled three-way fuel injection control valve assembly of the present invention.

Referring now to FIG. 5, a third embodiment of the present pilot valve controlled three-way fuel injection control valve assembly of the present invention is shown and indicated generally at 150 which is the same as the previous embodiment except that drain valve member 152 and supply valve member 154 are positioned in side-by-side relationship in respective valve chambers 156 and 158. As a result, high pressure supply circuit 160 is directly connected to supply valve chamber 158 while a branch passage 162 delivers high pressure fuel to one end of bias plunger 164. Also, first control cavity 124 and second control cavity 126 are connected to drain passage and orifice 56 via respective connector passages 166 and 168. The present embodiment of FIG. 5 also includes a transition flow loss limiting feature indicated generally at 170 which is the same as that of the previous embodiment and similar to that discussed hereinabove with respect to the embodiment of FIGS. 1a–3. That is, transition flow loss limiting feature 170 includes the sizing of the cross sectional areas of drain valve member 152, supply valve member 154 and bias plunger 164, and the sizing of the supply valve and drain valve bias springs in accordance with the principles set forth in FIG. 2 so as to prevent opening overlap between supply valve member 154 and drain valve member 152 thereby minimizing transition flow loss during operation of the valve assembly.

Figure 6:
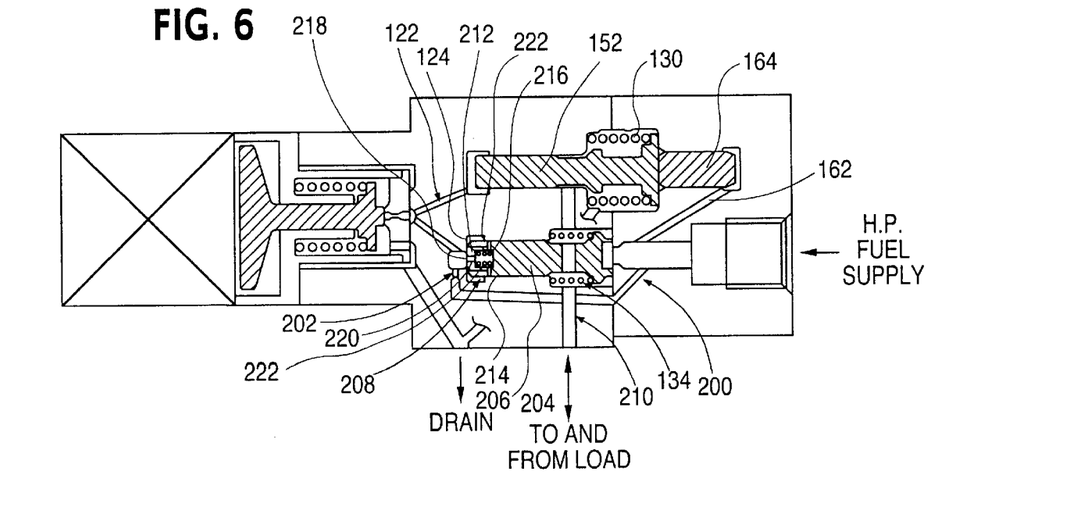
FIG. 6 is a cross sectional view of a fourth embodiment of the pilot valve controlled three-way fuel injection control valve assembly of the present invention including a rate shaping device.

FIG. 6 discloses a fourth embodiment of the present fuel injection control valve assembly which is identical to the previous embodiment of FIG. 5 except that the high pressure supply circuit 200, including supply orifice 202 is formed in valve housing 204 as opposed to being formed in supply valve member 206. Also, the present embodiment includes a rate shaping device 208 for slowing down the initial flow of high pressure fuel to outlet circuit 210 during the initial portion of the supply period or injection event. Rate shaping device 208 includes a flow limiting valve 212 mounted in supply valve chamber 214 and first control cavity 124 of control volume 122. Flow limiting valve 212 is in the form of a slidably mounted piston biased away from supply valve member 206 by a spring 216. The limiting valve 212 includes a central flow limiting orifice 218, a valve surface 220 for sealingly engaging one end of valve cavity 214 and axial flow passages 222 formed in its outer surface. As shown in FIG. 6 with injection control valve 58 in the de-energized position and supply valve member 206 in the closed position prior to an injection event, flow limiting valve 212 is positioned in sealing abutment against one end of valve chamber 214. Upon energization and opening of injection control valve 58, fuel flow from first control cavity 124 is limited by the cross sectional area of flow orifice 218 thereby causing a slower decrease in the control pressure in first control cavity 124 which, in turn, slows the rate of movement of supply valve member 206 thereby ultimately slowing the rate of fuel injection during the initial portion of an injection event. Upon de-energization and closing of injection control valve 58, the spring biased flow limiting valve 212 moves to the right in FIG. 6 permitting unrestricted flow into first control cavity 124 via passage 218 and passages 222 thereby ensuring a quick closing of supply valve member 206. Of course, the rate of opening of supply valve member 206 can be modified by selecting the appropriate size of the rate shaping orifice 218. This rate shaping capability has been shown to improve noise control while minimizing emissions.

Figure 7A:
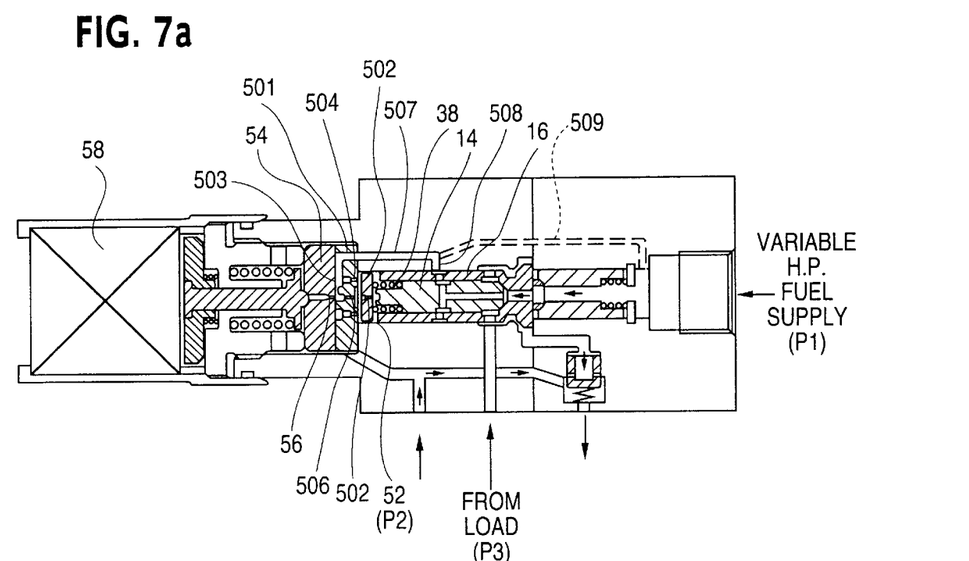
FIG. 7a is a cross sectional view of a pilot valve controlled three-way fuel injection control valve assembly similar to the preferred embodiment shown in FIG. 1a but with a rate shaping feature wherein the valve is shown in the closed and de-energized state.
Figure 7B:
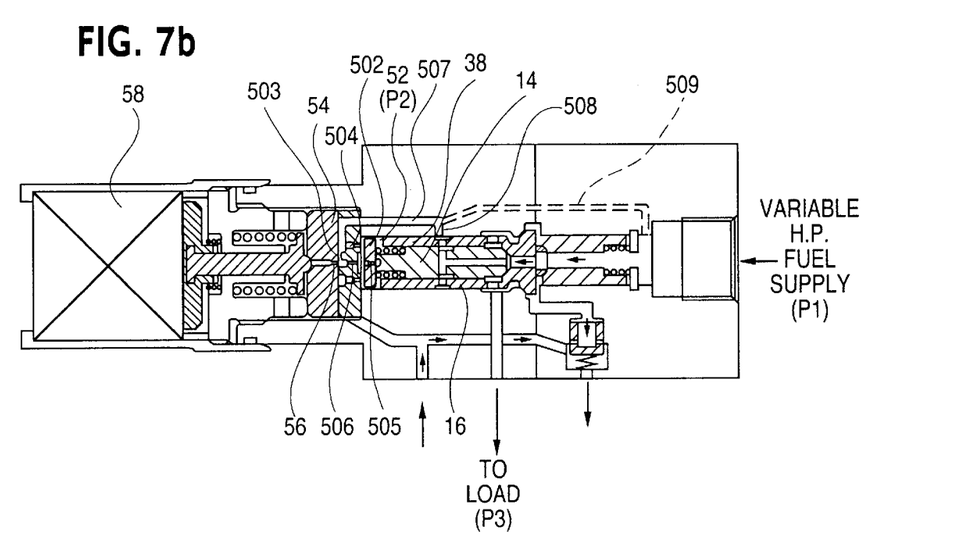
FIG. 7b is a cross sectional view of the pilot valve controlled three-way fuel injection control valve assembly of FIG. 7a in the open and energized state.

FIGS. 7a and 7b discloses a fifth embodiment of the present pilot valve controlled three-way fuel injection control valve assembly which is identical to the preferred embodiment shown in FIGS. 1a and 1b except that a rate shaping device 500 is included in control cavity 52. The purpose of the rate shaping device is to slow the rate of injection pressure rise during the initial portion of the injection event, but allow a very rapid decay of injection pressure at the end of the injection event. Referring to FIGS. 7a and 7b, the rate shaping device includes a seat 54, an orifice plate 501, and a spring biased flow limiting valve 502. A passage 507 supplies the high pressure fuel to the orifice plate. Either passage 508 or passage 509 can be used to supply the high pressure fuel to passage 507. Using passage 509 avoids adding additional leakage past the close fitting clearances of supply valve 14 and drain valve 16. Flow limiting valve 502 includes a first opening rate orifice 505. The orifice plate 501 includes a supply orifice 503, a second opening rate orifice 506, and one or more closing rate orifices 504. Referring to FIG. 7b, upon energization and opening of the injection control valve, flow limiting valve 502 is held closed by spring 38 and the pressure difference across flow limiting valve 502. Thus fuel in control cavity 52 passes through first opening orifice 505 and second opening orifice 506 and drain orifice 56. This results in a slower supply valve 14 opening thus resulting in a slow rate of injection pressure rise during the initial portion of the injection event. Referring to FIG. 7a, upon de-energization and closing of the injection control valve, the high pressure fuel passes through supply orifice 503, second opening rate orifice 506 and first opening rate orifice 505 into control cavity 52. The pressure in control cavity 52 increases causing supply valve 14 to begin to close allowing spring biased flow limiting valve 502 to move to the right permitting additional flow into control cavity 52 via closing rate orifices 504 resulting in a very rapid closing of supply valve 14 and opening of drain valve 16.

Figure 8:
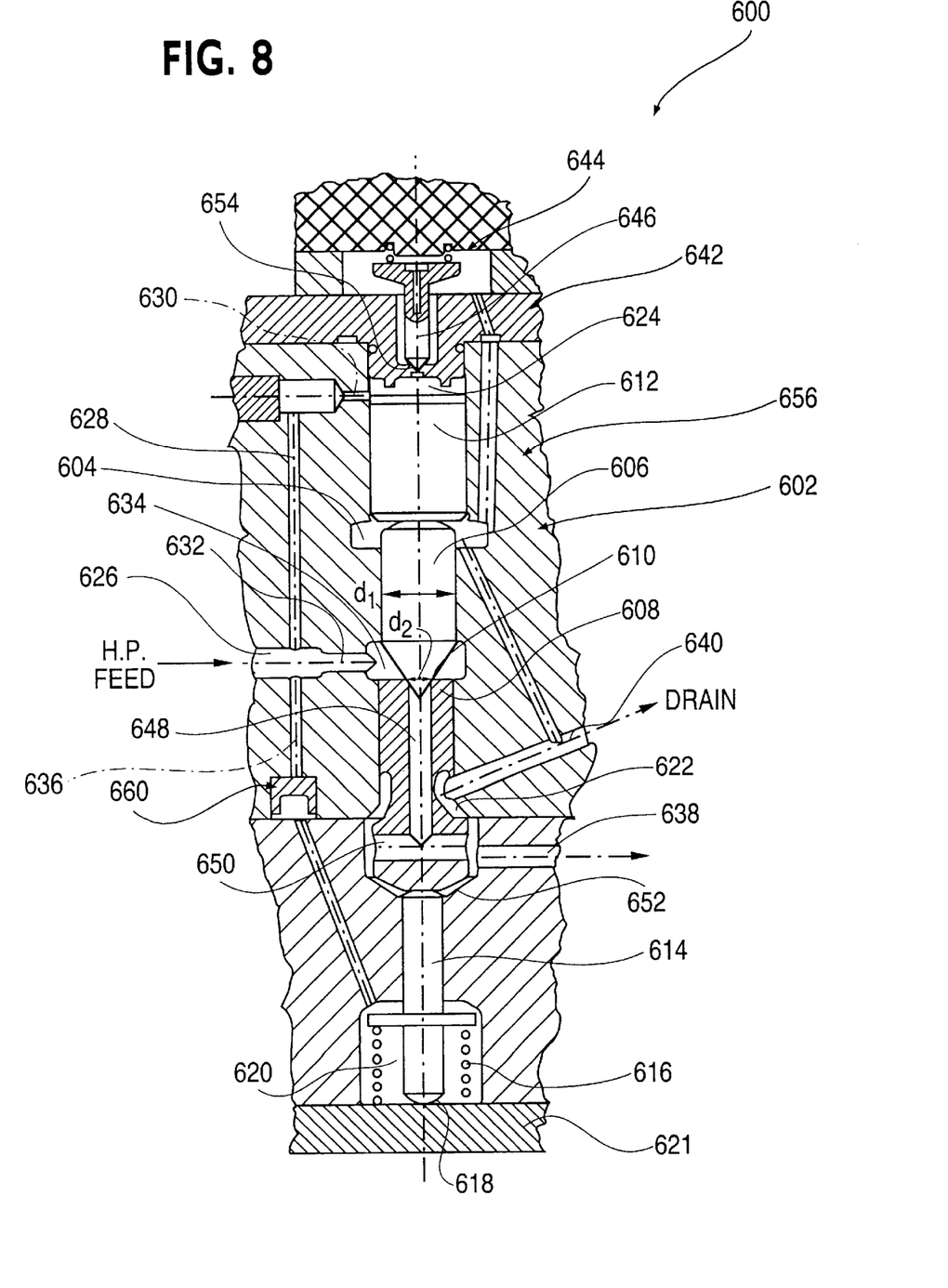
FIG. 8 is a cross sectional view of a pilot valve controlled three-way fuel injection control valve assembly in the closed and de-energized state with the control pressure acting on a control plunger.

FIG. 8 discloses a sixth embodiment of the pilot valve controlled three-way fuel injection control valve assembly of the present invention having various plungers or valve members positioned generally in series. Pilot valve controlled three-way fuel injection control valve assembly 600 includes a multi-part valve housing 602 forming a valve cavity 604. A supply valve member 606 and a drain valve member 608 are positioned in end-to-end relationship in valve cavity 604 and mounted for reciprocal movement. Drain valve member 608 includes an annular first valve seat 610 formed on its inner end for sealing engagement by a conical end of supply member 606. A control plunger 612 is positioned for abutment against an opposite end of supply valve member 606 from drain valve member 608. Likewise, a bias plunger 614 is positioned for abutment against an opposite end of drain valve member 608 from supply valve member 606. Bias plunger 614 is biased into engagement with drain valve member 608 by a bias spring 616 and fluid pressure generated forces acting on surface area 618 due to high pressure fuel in cavity 620. An annular second valve seat 622 is formed on valve housing 602 for sealing engagement by drain valve member 608.

Fuel injection control valve assembly 600 further includes a control volume 624 formed adjacent one end of control plunger 612 opposite supply valve member 606 for receiving high pressure fuel from a high pressure supply circuit 626. High pressure supply circuit 626 includes a first passage 628 for delivering high pressure fuel to control volume 624 via a supply orifice 630, a connector passage 632 for delivering high pressure fuel to an inlet annulus 634 and a delivery passage 636 for delivering high pressure fuel to cavity 620. An outlet circuit 638 is provided to deliver high pressure fuel to a load device such as a fuel injector. Also, a drain circuit 640 is formed in valve housing 602 and communicates with valve cavity 604. Fuel injection control valve assembly 600 further includes a valve control device 642 including control volume 624 and a fuel injection control valve 644 comprised of a reciprocally mounted valve element 646. Similar to the previously discussed embodiments, fuel injection control valve 644 controls the flow of high pressure fuel from control volume 624 so as to control the movement of the various plungers and members. An axial passage 648 is formed in drain valve member 608 to supply high pressure fuel to outlet circuit 638 via a transverse passage 650 and outlet annulus 652 when supply valve member 606 is moved into an open position. Valve element 646 is biased into a closed position against a valve seat to block flow through a drain orifice 654. The embodiment of FIG. 8 also includes a transition flow loss limiting feature or means 656 which importantly functions to cause drain valve member 608 to be positioned in the closed position throughout the period in which supply valve member 606 is in an open position thereby minimizing high pressure supply fuel flow to drain circuit 640 during the opening and closing of supply valve member 606. That is, transition flow loss limiting feature 656 ensures that drain valve member 608 closes prior to the opening of supply valve member 606 and that drain valve member 608 opens after supply valve member 606 closes during a given supply period or injection event. Referring to FIG. 8, the various cross sectional areas of control plunger 612, supply valve member 606, drain valve member 608 and bias plunger 614, and the spring force of bias spring 616, are sized relative to one another so as to ensure that no overlap exists between the opening and closing of supply valve member 606 and drain valve member 608. For example, transition flow loss limiting feature may include forming bias plunger 614 with a diameter equal or slightly bigger than diameter d, wherein d is calculated using the following equation:

$$d = \sqrt{d_1^2 - d_2^2}$$

where:
 d₁=supply valve diameter
 d₂=supply valve seat 610 sealing diameter

The sealing diameter at the outlet or second valve seat 622 is equal to, or preferably slightly larger than, the diameter of the smaller end of drain valve member 608. Finally, the diameter of control plunger 612 should be greater than the diameter of supply valve member 606, and also large enough to generate a fluid pressure induced bias force at minimum operating pressure which overcomes the force generated on the closed supply valve member 606 plus drain valve member 608 plus the force on bias plunger 614 and the bias load of spring 616.

During operation, with the valve in the de-energized state as shown in FIG. 8, valve element 646 blocks the flow of high pressure fuel from control volume 624 thereby causing the high pressure fuel in control volume 624 to bias control plunger 612 thereby biasing supply valve member 606 into a closed position against valve seat 610 blocking high pressure fuel to outlet circuit 638. Also, the fluid pressure induced biasing forces acting on control plunger 612 in control volume 624 causes drain valve member 608 to be positioned in an open position a spaced distance from annular second valve seat 622. Thus, outlet circuit 638 is connected to drain circuit 640. When fuel injection pilot control valve 644 is energized, valve element 646 moves into an open position permitting high pressure fuel to drain from control volume 624 through drain orifice 654 thereby lowering the pressure in control volume 624. The cross sectional flow area of drain orifice 654 is greater than the cross sectional flow area of supply orifice 630 thereby permitting a decrease in the pressure in control volume 624. The rate and amount of pressure decrease is controllable by designing a predetermined ratio of the two flow areas and the volume of the control volume 624 as desired. When the pressure in control volume 624 drops to a predetermined level, the resultant of forces, acting on supply valve member 606, drain valve member 608 and bias plunger 614, overcomes the fluid pressure force in control volume 624, plunger 612, member 606 and 608 and bias plunger 614 will begin moving upwards in the orientation shown in FIG. 8. During this initial motion, supply valve member 606 remains in the closed position against annular first valve seat 610, until drain valve member 608 engages annular second valve seat 622. At this point, supply valve member 606 separates from drain valve member 608 creating an opening at annular first valve seat 610 and permitting high pressure fuel to flow from inlet annulus 634 to outlet circuit 638 via axial passage 648, transverse passage 650 and outlet annulus 652. Upon de-energization of fuel injection pilot control valve 644, valve element 646 moves into a closed position blocking flow through drain orifice 654 thereby causing the pressure in control volume 624 to increase which, in turn, forces control plunger 612 and supply valve member 606 downwardly. Initially, supply valve member 606 will seat against annular first valve seat 610 blocking high pressure fuel to outlet circuit 638. Then, all four movable members, that is, control plunger 612, supply valve member 606, drain valve member 608 and bias plunger 614, will continue to move downwardly toward cover plate 621. The initial movement of drain valve member 608 downwardly will cause drain valve member 608 to move away from annular second valve seat 622 thereby connecting outlet circuit 638 to drain circuit 640 subsequent to the closing of supply valve member 608. In this manner, the present embodiment also eliminates transition flow losses during the movement of the valve members between the open and closed positions. The response time and mechanical impact can be maintained within a relatively wide range by choosing appropriate sizes for the various parts, i.e. diameter of valves, plungers and orifice, chamber volumes, spring preload and sealing diameters. A rate shaping device indicated generally at 660 may also be provided to create an initial slow rate of fuel supply.

Figure 9:
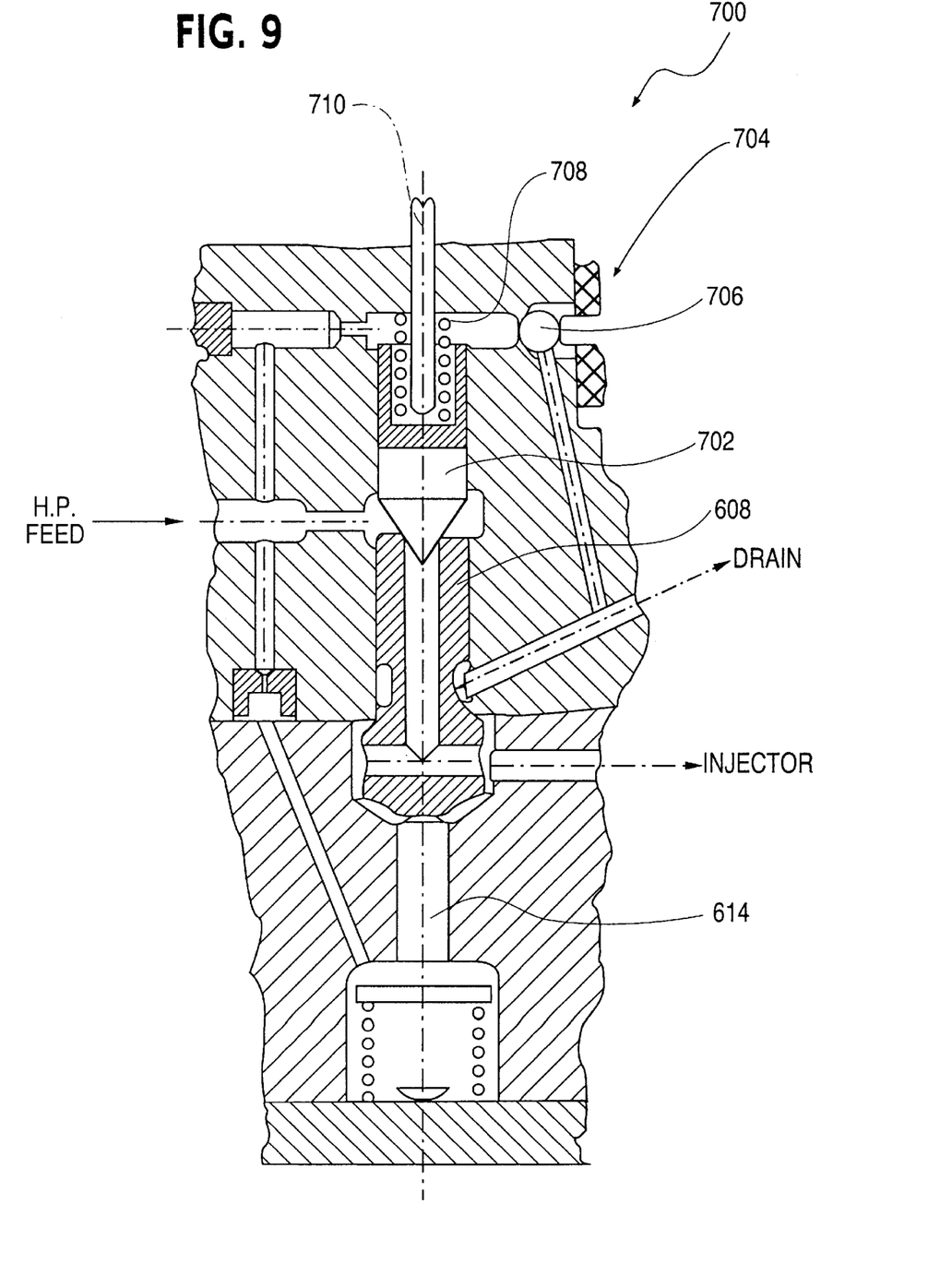
FIG. 9 is a cross sectional view of a pilot valve controlled three-way fuel injection control valve assembly in the closed and de-energized state similar to that shown in FIG. 8 but without the control plunger wherein the control pressure acts on the inlet valve.

FIG. 9 illustrates yet another embodiment of the pilot valve controlled three-way fuel injection control valve assembly of the present invention, indicated generally at 700, which is essentially the same as the previous embodiment except the control plunger is integrated into the supply valve member 702 and the fuel injection pilot control valve 704 is positioned on the side of the valve assembly. Fuel injection pilot control valve assembly 704 includes a valve element 706 movable along an axis transverse to the reciprocating axis of the valve assembly. This design may provide for improved packaging in certain applications while including less parts and less leakage loss. An additional bias spring 708 is provided to bias supply valve member 702 into abutment with drain valve member 608. An adjustable top-stop 710 may be provided to adjust the stroke of supply valve member 702. Likewise, a similar top-stop adjustment mechanism may be provided for bias plunger 614.

INDUSTRIAL APPLICABILITY

The pilot valve controlled three-way control valve assembly of the present invention may be readily adapted to control the flow of air, hydraulic fluid or fuel in a variety of known pneumatic, hydraulic and fuel systems. The three-way control valve assembly, including the transition flow loss limiting feature of the present invention, is especially effective in controlling the flow of fuel to one or more injectors in a high pressure fuel system of an internal combustion engine where handling very high fuel pressures with extremely fast valve response is required.

We claim:
1. A three-way fuel injection control valve assembly, comprising:
 a valve housing containing at least one valve chamber and a high pressure supply circuit, a drain circuit and an outlet circuit communicating with said at least one valve chamber;
 a first valve member mounted for reciprocal movement within said at least one valve chamber between a closed position in which said high pressure supply circuit is isolated from said outlet circuit and an open position in which said high pressure supply circuit is in fluid communication with said outlet circuit;
 a second valve member mounted for reciprocal movement within said at least one valve chamber between an open position in which said outlet circuit is in fluid communication with said drain circuit and a closed position in which said outlet circuit is isolated from said drain circuit; and
 a valve control means for controlling the movement of said first and said second valve members between respective open and closed positions, said valve control means including a control volume positioned adjacent outer ends of said first valve member and said second valve member for receiving high pressure fuel from said high pressure supply circuit and an electronically controlled injection control valve positioned along said drain circuit for controlling the flow of fuel from said high pressure supply circuit through said drain circuit so as to cause the movement of said first and said second valve members between respective open and closed positions.

2. The valve assembly of claim 1, wherein movement of said first valve member from said closed position to said open position and from said open position to said closed position defines a supply period, said valve control means further including a transition flow loss limiting means for causing said second valve member to be positioned in said closed position throughout said supply period when said first valve member is in said open position to minimize high pressure supply fuel flow to drain during opening and closing of said first valve member.

3. The valve assembly of claim 2, wherein said transition flow loss limiting means includes a biasing means for biasing said second valve member toward at least one of said open and said closed positions, said biasing means including a pressure bias surface associated with said second valve member for creating fuel pressure biasing forces tending to move said second valve member toward said closed position.

4. The valve assembly of claim 3, wherein said biasing means includes a bias plunger, said pressure bias surface formed on said bias plunger, said biasing means further including a bias spring for biasing said bias plunger toward said second valve member.

5. The valve assembly of claim 4, wherein said high pressure supply circuit includes a first supply passage formed in said first valve member.

6. The valve assembly of claim 5, wherein said high pressure supply circuit further includes a second supply passage formed in said second valve member for delivering high pressure fuel to said first supply passage.

7. The valve assembly of claim 6, wherein said high pressure supply circuit further includes a third supply passage formed in said bias plunger.

8. The valve assembly of claim 7, wherein said first, said second and said third supply passages extend along a common longitudinal axis.

9. The valve assembly of claim 1, further including a first valve seat formed on said second valve member for sealing engagement by said first valve member when said first valve member is in said closed position and a second valve seat formed on said valve housing for sealing engagement by said second valve member when said second valve member is in said closed position, said control volume being positioned axially between said injection control valve and said first and said second valve seats.

10. The valve assembly of claim 1, wherein said injection control valve is a two-way valve and includes a solenoid actuator assembly.

11. The valve assembly of claim 3, wherein said transition flow loss limiting means further includes a differential pressure area means formed on said first valve member for causing pressure forces tending to close said first valve member to be greater than pressure forces tending to open said first valve member when said first valve member is in said closed position, said transition flow loss limiting means further including a first valve bias spring for biasing said first valve toward said closed position.

12. The valve assembly of claim 1, wherein said drain circuit includes a drain orifice for establishing a minimum control pressure when said injection control valve is in an open position, said high pressure supply circuit including a supply orifice for limiting the supply flow to said injection control valve.

13. The valve assembly of claim 1, further including a cavitation control means for minimizing cavitation is said outlet circuit, said cavitation control means including a pressure regulating means positioned in said drain circuit for maintaining fuel in said outlet circuit at a regulated pressure when said second valve member is in said open position.

14. The valve assembly of claim 1, further including a rate shaping means positioned to control fuel flow from said control volume for causing a gradual increase in fuel pressure in said outlet circuit.

15. The valve assembly of claim 14, wherein said rate shaping means includes a spring-biased flow limiting valve mounted adjacent said outer end of said first valve member for permitting unrestricted flow into said control volume and limiting flow from said control volume.

16. The valve assembly of claim 1, wherein said second valve member contains a cavity opening into at least one end of said second valve member, said first valve member being telescopingly received in said cavity of said second valve member.

17. A three-way fuel injection control valve assembly, comprising:

a valve housing containing at least one valve chamber and a high pressure supply circuit, a drain circuit and an outlet circuit communicating with said at least one valve chamber;

a supply valve member mounted for reciprocal movement within said at least one valve chamber between a closed position in which said high pressure supply circuit is isolated from said outlet circuit and an open position in which said high pressure supply circuit is in fluid communication with said outlet circuit, movement of said supply valve member from said closed position to said open position and from said open position to said closed position defining a supply period;

a drain valve member mounted for reciprocal movement within said at least one valve chamber between an open position in which said outlet circuit is in fluid communication with said drain circuit and a closed position in which said outlet circuit is isolated from said drain circuit;

a control volume positioned to receive high pressure fuel from said high pressure supply circuit;

a solenoid operated two-way injection control valve positioned along said drain circuit for controlling the flow of fuel from said control volume through said drain circuit so as to cause the movement of said supply and said drain valve members between respective open and closed positions; and a transition flow loss limiting means for causing said drain valve member to be positioned in said closed position throughout said supply period when said supply valve member is in said open position to minimize high pressure supply fuel flow to drain during opening and closing of said supply valve member.

18. The valve assembly of claim 17, wherein said transition flow loss limiting means includes a biasing means for biasing said drain valve member toward at least one of said open and said closed positions, said biasing means including a pressure bias surface associated with said drain valve member for creating fuel pressure biasing forces tending to move said drain valve member toward said closed position.

19. The valve assembly of claim 18, wherein said biasing means includes a bias plunger, said pressure bias surface formed on said bias plunger, said biasing means further including a bias spring for biasing said bias plunger toward said drain valve member.

20. The valve assembly of claim 19, wherein said high pressure supply circuit includes a first supply passage formed in said supply valve member.

21. The valve assembly of claim 20, wherein said high pressure supply circuit further includes a second supply passage formed in said drain valve member for delivering high pressure fuel to said first supply passage and a third supply passage formed in said bias plunger.

22. The valve assembly of claim 21, further including a supply valve seat formed on said drain valve member for sealing engagement by said supply valve member when said supply valve member is in said closed position and a drain valve seat formed on said valve housing for sealing engagement by said drain valve member when said drain valve member is in said closed position, said control volume being positioned axially between said injection control valve and said supply and said drain valve seats.

23. The valve assembly of claim 17, wherein said transition flow loss limiting means further includes a differential pressure area means formed on said supply valve member for causing pressure forces tending to close said supply valve member to be greater than pressure forces tending to open said supply valve member when said supply valve member is in said closed position, said transition flow loss limiting means further including a supply valve bias spring for biasing said supply valve member toward said closed position.

24. The valve assembly of claim 17, further including a cavitation control means for minimizing cavitation is said outlet circuit, said cavitation control means including a pressure regulating means positioned in said drain circuit for maintaining fuel in said outlet circuit at a regulated pressure when said drain valve member is in said open position.

25. The valve assembly of claim 17, further including a rate shaping means positioned to control fuel flow from said control volume for causing a gradual increase in fuel pressure in said outlet circuit.

26. The valve assembly of claim 25, wherein said rate shaping means includes a spring-biased flow limiting valve mounted adjacent said outer end of said supply valve member for permitting unrestricted flow into said control volume and limiting flow from said control volume.

27. The valve assembly of claim 17, wherein said drain valve member contains a cavity opening into at least one end of said drain valve member, said supply valve member being telescopingly received in said cavity of said drain valve member.

* * * * *